(12) United States Patent
Kim et al.

(10) Patent No.: US 11,016,328 B2
(45) Date of Patent: May 25, 2021

(54) DISPLAY PANEL AND COLOR CONVERSION PANEL

(71) Applicant: Samsung Display Co., Ltd., Yongin-Si (KR)

(72) Inventors: Jangil Kim, Asan-si (KR); Jeongki Kim, Hwaseong-si (KR); Jong-hoon Kim, Seoul (KR); Jeaheon Ahn, Hwaseong-si (KR); Myoungjong Lee, Cheonan-si (KR); Seok-joon Hong, Seongnam-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/559,316

(22) Filed: Sep. 3, 2019

(65) Prior Publication Data

US 2020/0159065 A1    May 21, 2020

(30) Foreign Application Priority Data

Nov. 20, 2018   (KR) .......................... 10-2018-0143750

(51) Int. Cl.
*G02F 1/1335* (2006.01)
*G02F 1/13357* (2006.01)
*H01L 27/32* (2006.01)

(52) U.S. Cl.
CPC .. *G02F 1/133514* (2013.01); *G02F 1/133512* (2013.01); *G02F 1/133617* (2013.01); *H01L 27/322* (2013.01)

(58) Field of Classification Search
CPC ......... G02F 1/133514; G02F 1/133512; G02F 1/133617; H01L 27/322
See application file for complete search history.

(56) References Cited

U.S. PATENT DOCUMENTS

| | | | | |
|---|---|---|---|---|
| 2004/0201798 | A1* | 10/2004 | Yeh | ................... G02F 1/133516 349/106 |
| 2005/0105017 | A1* | 5/2005 | Choi | ................. G02F 1/133516 349/109 |
| 2013/0128193 | A1 | 5/2013 | Yang et al. | |
| 2018/0088405 | A1* | 3/2018 | Nagasawa | ......... G02F 1/133512 |
| 2018/0156951 | A1 | 6/2018 | Baek et al. | |
| 2019/0391418 | A1* | 12/2019 | Yamaguchi | ............ C09K 19/42 |

FOREIGN PATENT DOCUMENTS

| | | |
|---|---|---|
| KR | 10-0698052 B1 | 3/2007 |
| KR | 10-2015-0125207 A | 11/2015 |

* cited by examiner

*Primary Examiner* — Nathanael R Briggs
(74) *Attorney, Agent, or Firm* — Innovation Counsel LLP

(57) ABSTRACT

Provided is a display panel in which a first pixel region, a second pixel region, a third pixel region, and a light-blocking region may be defined. The first substrate may include a base layer; a first color filter layer overlapping the light-blocking region and the first pixel region; a light blocking layer overlapping the light-blocking region; a second color filter layer overlapping the second pixel region; a third color filter layer overlapping the third pixel region; and a step compensation layer disposed on one surface of the light-blocking layer and configured to cover at least a portion of the light-blocking region adjacent to the first pixel region when viewed in a plane.

21 Claims, 13 Drawing Sheets

DISPLAY PANEL AND COLOR CONVERSION PANEL

CROSS-REFERENCE TO RELATED APPLICATIONS

This U.S. non-provisional patent application claims priority under 35 U.S.C. § 119 to Korean Patent Application No. 10-2018-0143750, filed on Nov. 20, 2018, the entire contents of which are hereby incorporated by reference.

BACKGROUND

The present disclosure herein relates to a display panel, and more particularly, to a display panel including a color filter.

Display panels include transmissive display panels which selectively transmit source light generated from a light source and emissive display panels which generate source light by themselves. In order to generate a color image, the display panels may each include different types of color control layers according to pixels. The color control layers may transmit only a portion of wavelength range of source light, or convert the color of the source light. A portion of color control layers may also change the characteristics of light without changing the color of the source light.

SUMMARY

The present disclosure provides a display panel having improved flatness and reduced external light reflectivity.

An embodiment of the inventive concept provides a display panel including: a first substrate including a first pixel region, a second pixel region, a third pixel region, and a light-blocking region defined therein; a second substrate including a first element, a second element, and a third element respectively corresponding one-to-one to the first pixel region, the second pixel region, and the third pixel region, wherein the first substrate includes: a base layer; a first color filter layer disposed on one surface of the base layer and, when viewed in a plane, overlapping the light-blocking region and the first pixel region; a light blocking layer disposed on one surface of the first color filter layer and overlapping the light-blocking region in a plan view; a second color filter layer disposed on one surface of the base layer and overlapping the second pixel region in a plan view; a third color filter layer disposed on one surface of the base layer and overlapping the third pixel region in a plan view; and a step compensation layer disposed on one surface of the light-blocking layer and configured to cover at least a portion of the light-blocking region adjacent to the first pixel region in a plan view.

In an embodiment, the step compensation layer may include the same material as the second color filter layer.

In an embodiment, the step compensation layer may include the same material as the third color filter layer.

In an embodiment, the step compensation layer may include a first step compensation layer and a second step compensation layer, wherein the first step compensation layer may include the same material as the second color filter layer, and the second step compensation layer may include the same material as the third color filter layer.

In an embodiment, the first color filter layer may be a blue color filter layer, the second color filter layer may be a red color filter layer, and the third color filter layer may be a green color filter layer.

In an embodiment, the first pixel region may be one of a plurality of first pixel regions, the second pixel region may be one of a plurality of second pixel regions, a third pixel region may be one of a plurality of third pixel regions, the first pixel regions may be defined in a first direction, the second pixel regions may be defined in the first direction, and the third pixel regions may be defined in the first direction.

In an embodiment the step compensation layer may be disposed between the first pixel regions in a plan view.

In an embodiment, the second color filter layer may include: a second color main part covering the second pixel regions and extending in the first direction; and a second color protruding part protruding from the second color main part in a second direction crossing the first direction, wherein the second color protruding part may constitute the step compensation layer.

In an embodiment, the third color filter layer may include: a third color main part covering the third pixel regions and extending in the first direction; and a third color protruding part protruding from the third color main part in a second direction crossing the first direction, wherein the third color protruding part may constitute the step compensation layer.

In an embodiment, the second color filter layer may include: a second color main part configured to cover the second pixel regions and extending in the first direction; and a second color protruding part protruding from the second color main part in the second direction crossing the first direction, and the third color filter layer comprises: a third color main part configured to cover the third pixel regions and extending in the first direction; and a third color protruding part protruding from the third color main part in a direction toward the second color protruding part, wherein the second color protruding part and the third color protruding part may constitute the step compensation layer.

In an embodiment the step compensation layer may be disposed between the first pixel regions, between the first pixel regions and the second pixel regions, and between the first pixel regions and the third pixel regions in a plan view.

In an embodiment, side surfaces of the light-blocking layer may be completely covered by the step compensation layer.

In an embodiment, the first substrate may further include: a transmissive layer disposed under the first color filter layer and overlapping the first pixel region in a plan view; a first wavelength conversion layer disposed under the second color filter layer and overlapping the second pixel region in a plan view; and a second wavelength conversion layer disposed under the third color filter layer and overlapping the third pixel region in a plan view.

In an embodiment, the transmissive layer may include a base resin and a scattering body dispersed in the base resin, the first wavelength conversion layer may include a first emissive body configured to convert a wavelength of light incident from the second element, and the second wavelength conversion layer may include a second emissive body different from the first emissive body and configured to convert a wavelength of light incident from the third element.

In an embodiment, each of the first element, the second element, and the third element may include a first electrode, a second electrode and an emissive layer disposed between the first electrode and the second electrode, and the emissive layers of the first element, the second element, and the third element have an integrated shape.

The display panel may further include a liquid crystal layer disposed between the first substrate and the second substrate, wherein each of the first element, the second element, and the third element may include a pixel electrode.

In an embodiment of the inventive concept, a display panel includes: a first base layer; a circuit layer disposed on the first base layer; a second base layer facing the first base layer, the second base layer including first pixel regions disposed in a first direction, second pixel regions disposed in the first direction, third pixel regions disposed in the first direction and a light-blocking region surrounding the first to third pixel regions; a first color filter layer disposed under the second base layer and overlapping the light-blocking region and the first pixel regions the second base layer including; a light blocking layer disposed under the first color filter layer and overlapping the light-blocking region the second base layer including; a second color filter layer disposed under the second base layer and overlapping the second pixel regions the second base layer including; a third color filter layer disposed under the second base layer and overlapping the third pixel regions the second base layer including; and a step compensation layer disposed under the light-blocking layer and overlapping the light-blocking region disposed between adjacent first pixel regions the second base layer including.

In an embodiment, the first pixel regions, the second pixel regions, and the third pixel regions may alternately be defined in a second direction crossing the first direction.

In an embodiment, the second color filter layer may extend in the first direction, the step compensation layer may protrude from the second color filter layer in the second direction, and the step compensation layer may include the same material as the second color filter layer.

In an embodiment, the step compensation layer may include a first step compensation layer and a second step compensation layer, the second color filter layer may extend in the first direction, the first step compensation layer may protrude from the second color filter layer in the second direction, the first step compensation layer may include the same material as the second color filter layer, the third color filter layer may extend in the first direction, the second step compensation layer may protrude from the third color filter layer in the second direction, and the second step compensation layer may include the same material as the third color filter layer.

In an embodiment, the first step compensation layer and the second step compensation layer may be disposed between the adjacent first pixel regions in the first direction.

In an embodiment of the inventive concept, a color conversion panel includes: a base layer including first pixel regions and second pixel regions and a light blocking region surrounding the first pixel regions and the second pixel regions; a first color filter layer disposed to overlap the first pixel regions and the light-blocking region in a plan view; a light-blocking layer disposed to overlap the light-blocking region in a plan view; and a second color filter layer disposed to overlap the second pixel regions and the light blocking layer in a plan view. the second color filter layer may include a first portion extending in a first direction and a second portion extending substantially perpendicular to the first direction, and the second portion extends between adjacent first pixel regions to overlap the light-blocking layer.

In an embodiment, the second portion may completely cover a top surface and side surfaces of the light-blocking layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

and

Figure 11:
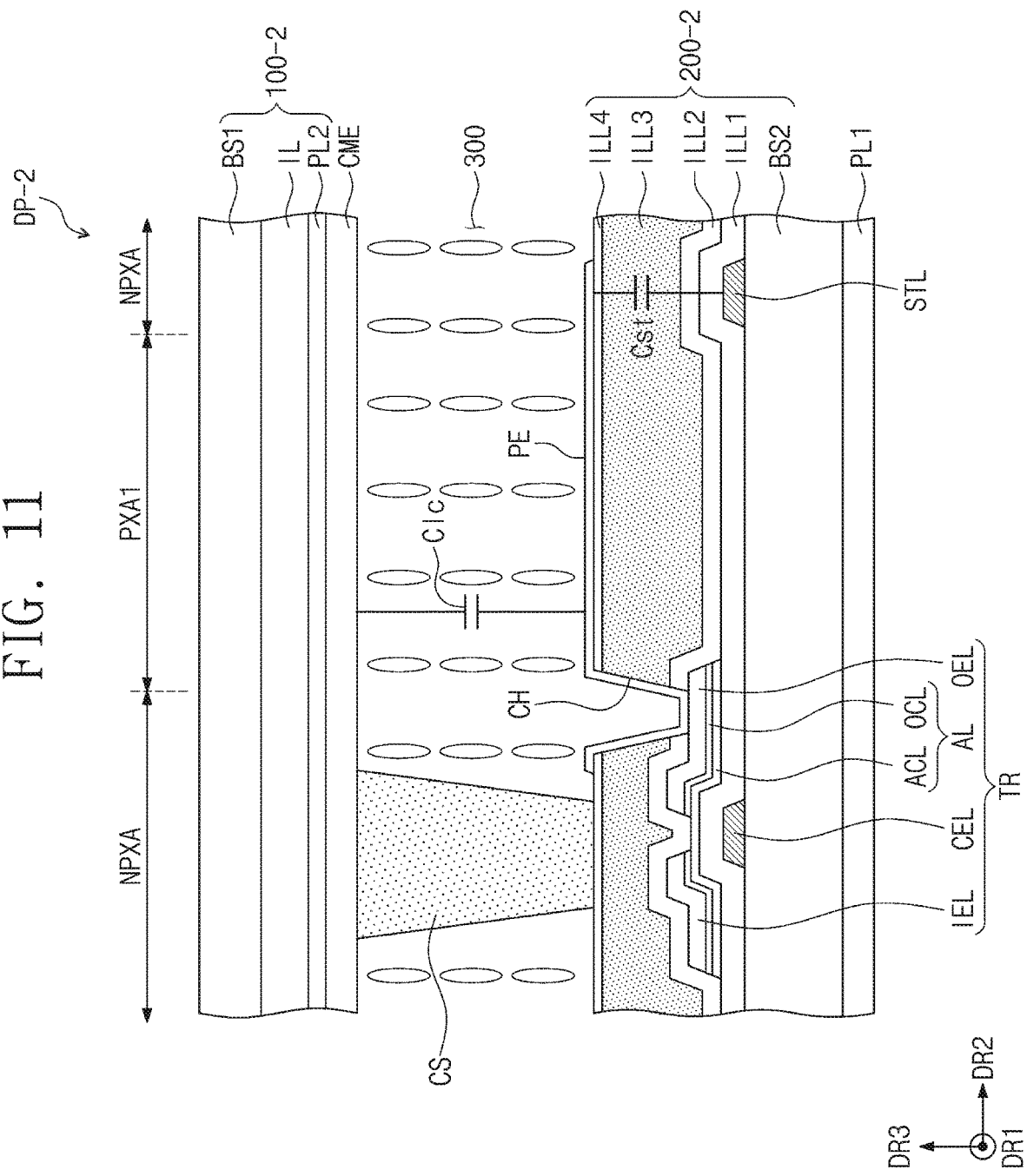

FIG. 11 is a cross-sectional view of a display panel according to an embodiment of the inventive concept.

DETAILED DESCRIPTION

In this specification, it will be meant that when an element (or region, layer, portion, etc.) is referred to as being "on", "connected to" or "coupled to" another element, it may be directly on, connected or coupled to the other element or a third elements may be interposed therebetween.

Like reference numbers refer to like elements. Also, in the figures, the dimensions of layers and regions are exaggerated for clarity of illustration.

The term "and/or" includes any of one or more combinations that may be defined by the associated listed items.

It will be understood that although the terms of first and second are used herein to describe various elements, these elements should not be limited by these terms. The above terms are only used to distinguish one component from other components. For example, a first element may be referred to as a second element and the second element may also be referred to as the first element without departing from the spirit and scope of the inventive concept. The terms of a singular form may include plural forms unless clearly referred to the contrary.

In addition, terms, such as "under", "below", "on", "above" and the like, may be used herein to describe relationships between the elements illustrated in figures. The above terms are relative concepts, and described with respect to the direction indicated in figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that in the specification, the meaning of 'include' or 'have' specifies a property, a numeral, a step, an operation, an element or a combination thereof, but does not exclude other properties, numerals, steps, operations, elements or combinations thereof.

Hereinafter, exemplary embodiments of the inventive concept will be described in detail with reference to the accompanying drawings.

Figure 1:
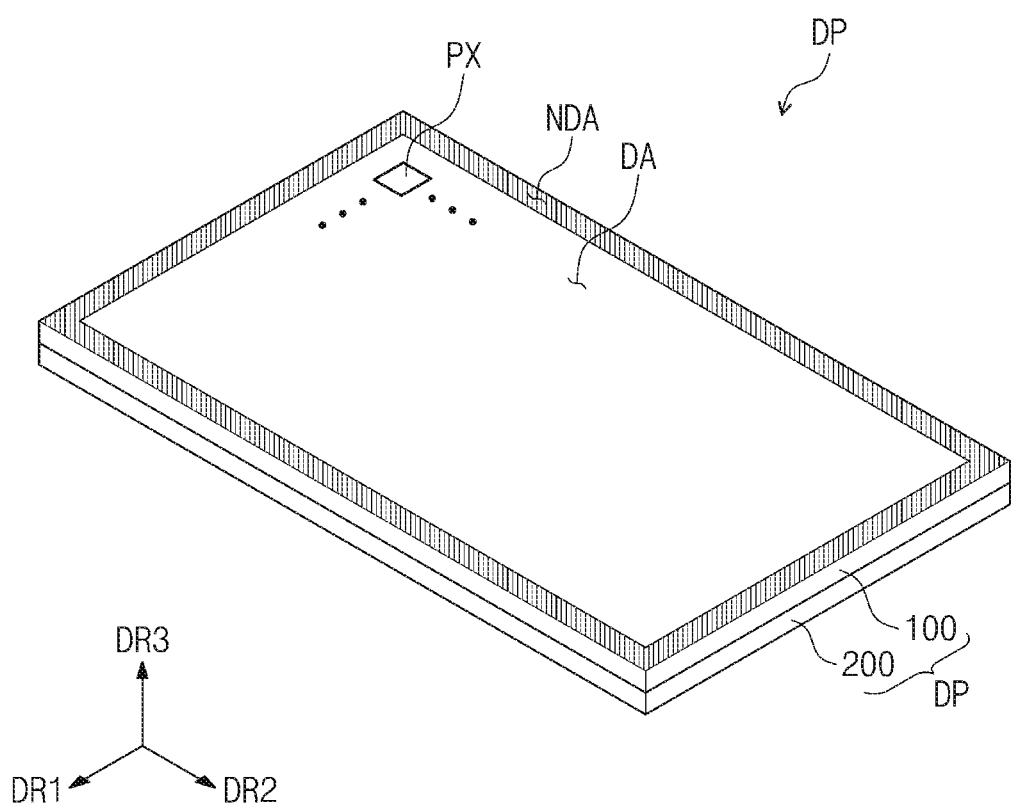
FIG. 1 is a perspective view of a display panel according to an embodiment of the inventive concept.

FIG. 1 is a perspective view of a display panel according to an embodiment of the inventive concept.

Referring to FIG. 1, in a display panel DP, a display region DA and a non-display region NDA may be defined.

The display region DA may be a region in which an image is displayed. The non-display region NDA may be a region in which any image is not displayed. Pixels PX are disposed in the display region DA, and the pixels PX may not be disposed in the non-display region NDA. The pixels PX may mean effective pixels which provide an image.

The display region DA is parallel to a surface defined by a first direction DR1 and a second direction DR2. The direction of the normal line of the display region DA, that is, the thickness direction of the display panel DP, is indicated by a third direction DR3. The front surface (or upper surface) and the rear surface (or lower surface) of each of constituents are distinguished by the third direction DR3. However, the directions indicated by the first to third directions DR1, DR2 and DR3 are relative concepts, and may be altered into other directions. Hereinafter, the first to third directions are the directions indicated by the first to third directions DR1, DR2 and DR3, and may refer to the same reference numerals.

The display panel DP may be used for large-sized electronic devices such as televisions, monitors, or external advertisement boards, and also be used for small and medium-sized electronic devices, such as personal computers, laptop computers, personal digital terminals, car navigation units, game machines, portable electronic apparatuses, and cameras. In addition, these are provided merely as examples, and, of course, the display panel DP may also be used for other electronic apparatuses.

A bezel region of the display panel DP may be the non-display region NDA. The non-display region NDA may be a region adjacent to the display region DA. The non-display region NDA may surround the display region DA. However, the embodiment of the inventive concept is not limited thereto, and the shape of the display region DA and the shape of the non-display region NDA may be relatively designed. In another embodiment of the inventive concept, the non-display region NDA may also be omitted.

The display panel DP may include a first substrate 100 and a second substrate 200. The first substrate 100 may include pixel regions and a light-blocking region, and the second substrate may include elements. This will be described below.

Figure 2:
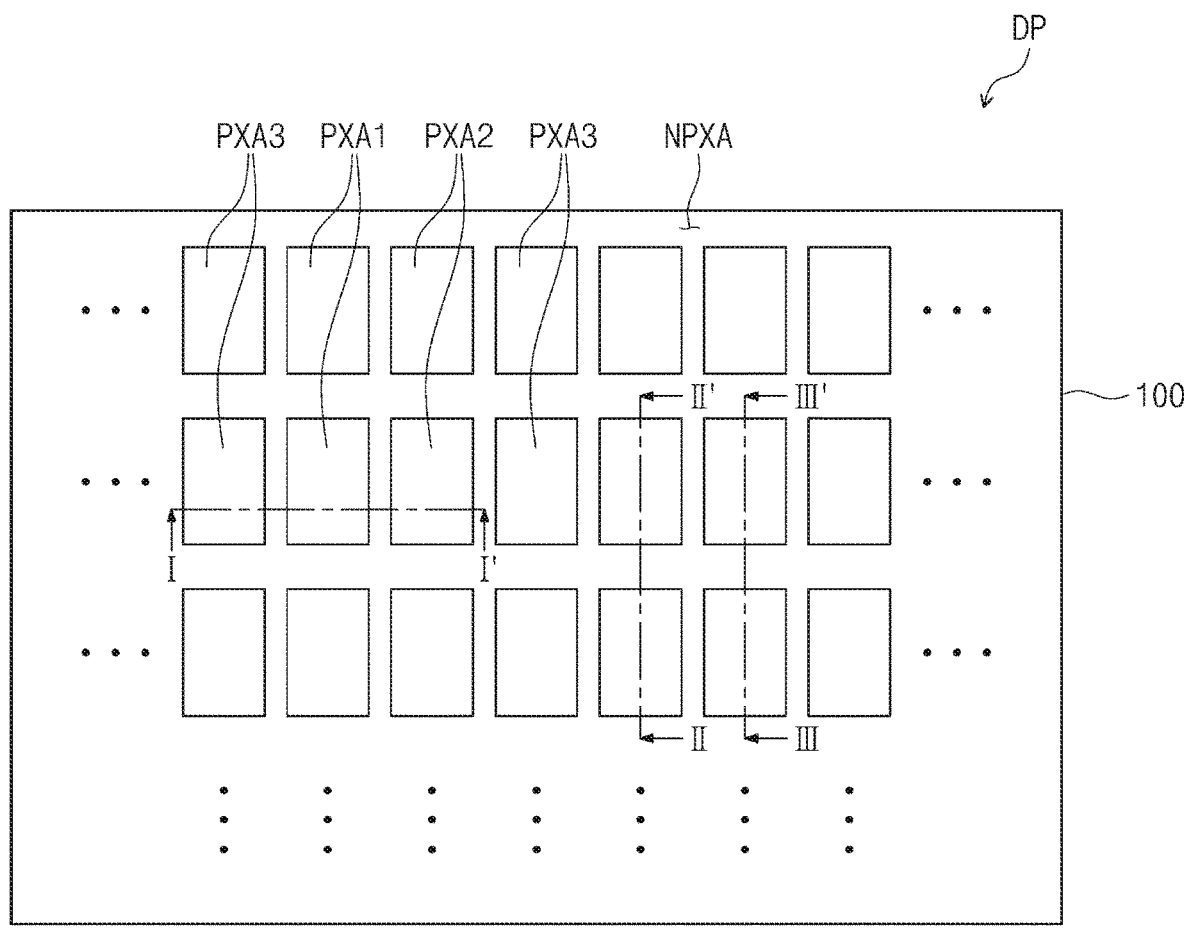
FIG. 2 is a plan view of display panel according to an embodiment of the inventive concept.
Figure 2:
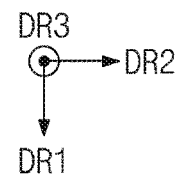

FIG. 2 is a plan view of display panel according to an embodiment of the inventive concept. FIG. 2 may be a plan view when the display panel DP is viewed from the upper surface thereof.

Referring to FIG. 2, in the first substrate 100, first pixel regions PXA1, second pixel regions PXA2, third pixel regions PXA3, and a light-blocking region NPXA may be defined. The first pixel regions PXA1 may provide first color light, the second pixel regions PXA2 may provide second color light, and the third pixel regions PXA3 may provide third color light. The first color light, the second color light, and the third color light may be light having different colors from each other. For example, one of the first to third color light may be blue light, another may be red light, and the other may be green light.

The first pixel regions PXA1 may be arranged in the first direction DR1, the second pixel regions PXA2 may be arranged in the first direction DR1, and the third pixel regions PXA3 may be arranged in the first direction DR1. The first pixel regions PXA1, the second pixel regions PXA2, and the third pixel regions PXA3 may be alternately arranged in the second direction DR2. For example, a single first pixel region, a single second pixel region, and a single third pixel region may be sequentially arranged in the second direction DR2.

The light-blocking region NPXA may be a region disposed adjacent to the first pixel regions PXA1, the second pixel regions PXA2, and the third pixel regions PXA3 to surround the first pixel regions PXA1, the second pixel regions PXA2, and the third pixel regions PXA3. The light-blocking region NPXA may define boundaries of the first pixel regions PXA1, the second pixel regions PXA2, and the third pixel regions PXA3. The light-blocking region NPXA may prevent color mixing between adjacent pixel regions in the first pixel regions PXA1, the second pixel regions PXA2, and the third pixel regions PXA3. In addition, the light-blocking region NPXA may block source light so that the source light is not provided to a user through the light-blocking region NPXA.

Figure 3:
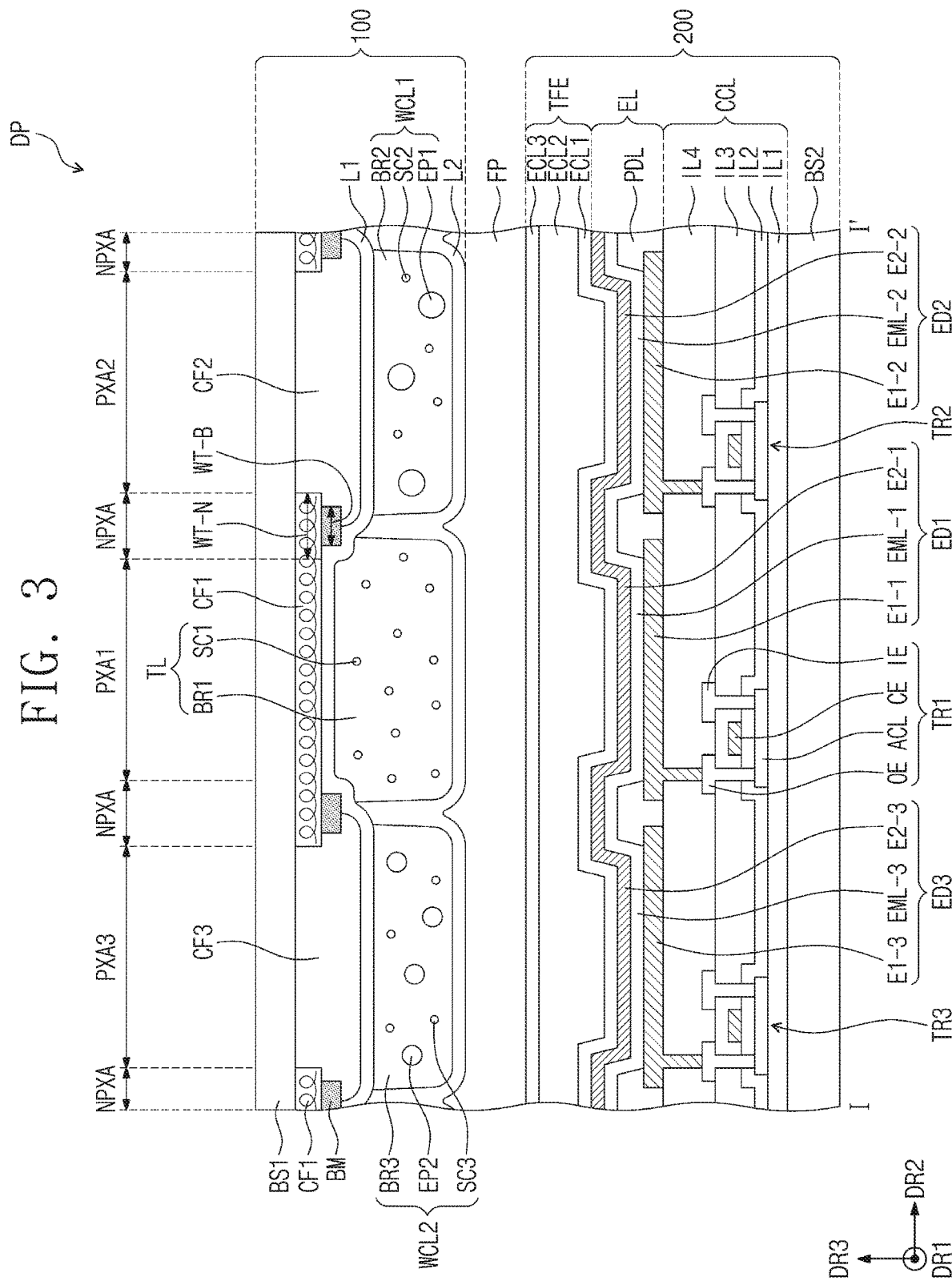
FIG. 3 illustrates a cross-sectional view taken along line I-I' of FIG. 2 according to an embodiment of the inventive concept.
Figure 4A:
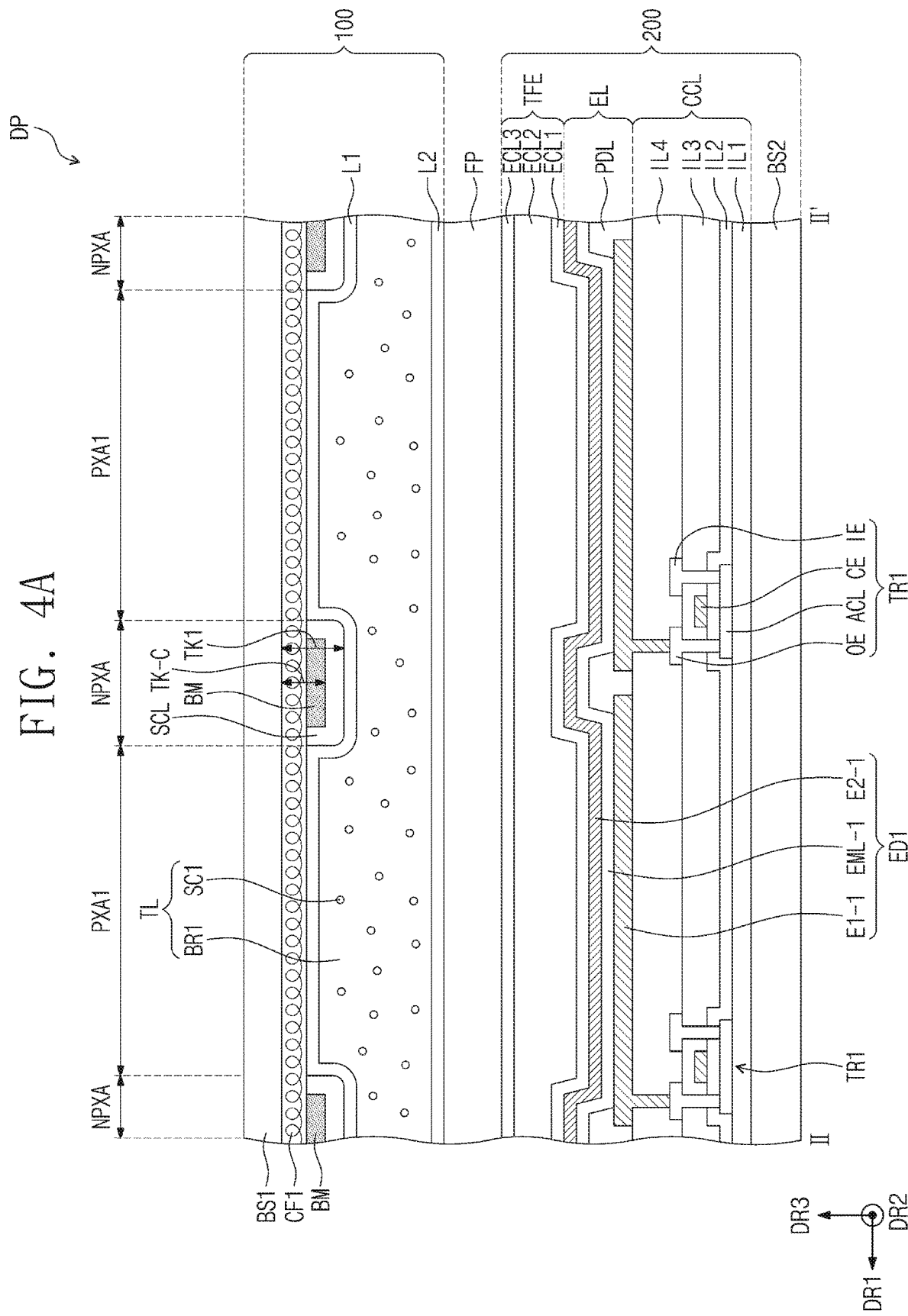
FIG. 4A illustrates a cross-sectional view taken along line II-II' of FIG. 2 according to an embodiment of the inventive concept.
Figure 4B:
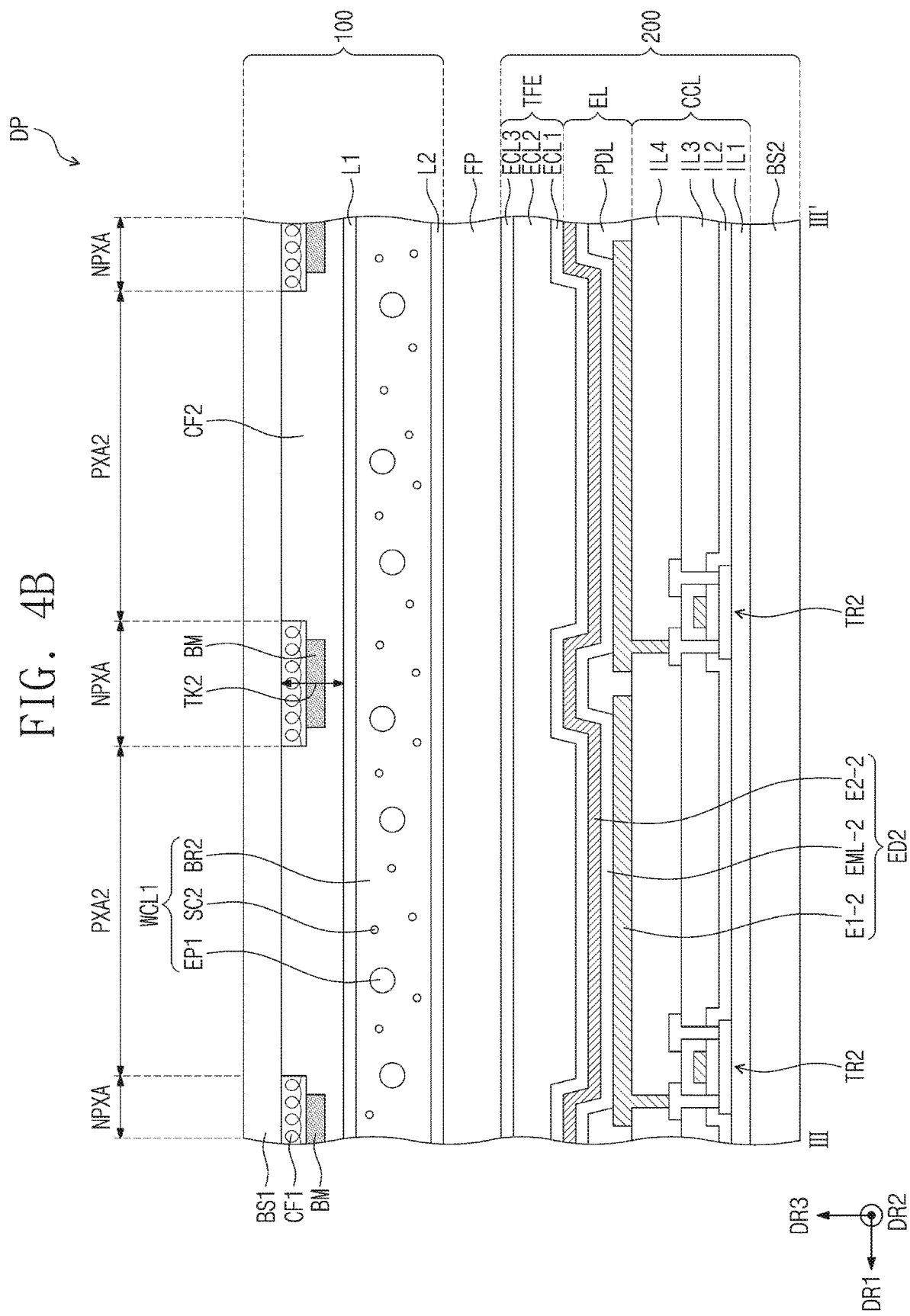
FIG. 4B illustrates a cross-sectional view taken along line III-III' of FIG. 2 according to an embodiment of the inventive concept.

FIG. 3 illustrates a cross-sectional view taken along line I-I' of FIG. 2 according to an embodiment of the inventive concept. FIG. 4A illustrates a cross-sectional view taken along line II-IF of FIG. 2 according to an embodiment of the inventive concept. FIG. 4B illustrates a cross-sectional view taken along line III-III' of FIG. 2 according to an embodiment of the inventive concept.

Referring to FIGS. 3, 4A, and 4B, a case in which the display panel DP is an organic light-emitting display panel is exemplarily illustrated. The display panel DP may include a first substrate 100 and a second substrate 200.

The first substrate 100 and the second substrate 200 may face each other. A filling member FP may be disposed between the first substrate 100 and the second substrate 200. The filling member FP may include an organic adhesive material. The first substrate 100 and the second substrate 200 may be coupled to each other by means of the filling member FP.

The first substrate 100 may include: a base layer BS1, first to third color filter layers CF1, CF2 and CF3, a step compensation layer SCL, a transmissive layer TL, first and second wavelength conversion layers WCL1 and WCL2, and first and second protective layers L1 and L2. In addition, first to third pixel regions PXA1, PXA2, PXA3 and light-blocking region NPXA may be defined in the first substrate 100. This has been described in FIG. 2. The first substrate 100 may be referred to as a color conversion panel.

The base layer BS1 may be a silicon substrate, a plastic substrate, a glass substrate, an insulating film, or a laminated structure including a plurality of insulating layers.

The first color filter layer CF1 may be disposed on one surface of the base layer BS1. For example, the first color filter layer CF1 may be disposed under the base layer BS1. In addition, the first color filter layer CF1 may come into direct contact with the base layer BS1. The first color filter layer CF1 may overlap the light blocking region NPXA and the first pixel regions PXA1 in a plan view. The first color filter layer CF1 may not overlap the second pixel regions PXA2 and the third pixel regions PXA3 in a plan view. That is, the first color filter layer CF1 may have a plurality of openings corresponding to the second pixel regions PXA2 and the third pixel regions PXA3.

On a surface of the first color filter layer CF1, the light blocking layer BM may be disposed. The light-blocking layer BM may overlap the light-blocking region NPXA in a plan view. In an embodiment of the inventive concept, the width WT-B of the light blocking layer BM may be narrower than the width WT-N of the light-blocking region NPXA. Considering that misalignment occurs during the formation of the light-blocking layer BM, the width WT-B of the light-blocking layer BM may be set narrower than the width WT-N of the light-blocking region NPXA. The widths WT-B and WT-N may mean the width in one direction on a cross-sectional surface, for example, the width in the second direction DR2.

The second color filter layer CF2 may be disposed on one surface of the base layer BS1. For example, the second color filter layer CF2 may be disposed under the base layer BS1. The second color filter layer CF2 may overlap the second pixel regions PXA2 in a plan view. The second color filter layer CF2 may be disposed under the light-blocking layer BM to overlap the light-blocking layer BM and the first color filter layer CF1. The second color filter layer CF2 may overlap only one edge of the light-blocking layer BM among edges opposing each other in a plan view. In this specification, the term "under" may mean the direction opposite to the direction in which the display panel DP provides an image.

The third color filter layer CF3 may be disposed on one surface of the base layer BS1. For example, the third color filter layer CF3 may be disposed under the base layer BS1 to overlap the light-blocking layer BM and the first color filter layer CF1. The third color filter layer CF3 may overlap only one edge of the light-blocking layer BM among edges opposing each other in a plan view. The third color filter layer CF3 may overlap the third pixel regions PXA3 in a plan view.

In an embodiment of the inventive concept, the light-blocking layer BM may include carbon black particles. A portion of light incident to the light-blocking layer BM may be reflected by the carbon black particles. According to an embodiment of the inventive concept, a portion of the first color filter layer CF1 is disposed between the light-blocking layer BM and the base layer BS1. Thus, the first color filter layer CF1 may absorb not only a portion of light incident onto the carbon black particles, but also the light reflected by the carbon black particles. Thus, reflection of external light at the light-blocking region NPXA is reduced by the first color filter layer CF1 disposed in the light-blocking region NPXA.

According to an embodiment of the inventive concept, the first color filter layer CF1 may be a color filter having the highest absorbance among color filters. For example, the first color filter layer CF1 may be a blue color filter layer, the second color filter layer CF2 may be a red color filter layer, and the third color filter layer CF3 may be a green color filter layer. However, this is exemplarily proposed, and the embodiment to the inventive concept is not limited thereto. For example, in another embodiment to the inventive concept, the first color filter layer CF1 may be a green color filter layer, and in another embodiment of the inventive concept, the first color filter layer CF1 may also be a red color filter layer.

Referring to FIG. 4A, the step compensation layer SCL may be disposed under the light-blocking layer BM. The lower surface and side surfaces of the light-blocking layer BM may be covered by the step compensation layer SCL. The step compensation layer SCL may include the same material as at least one of the second color filter layer CF2 or the third color filter layer CF3. For example, in an embodiment of the inventive concept, the step compensation layer SCL may include the same material as the second color filter layer CF2, and the step compensation layer SCL may simultaneously be formed with the second color filter layer SF2 via the same process. In an embodiment of the inventive concept, the step compensation layer SCL may include the same material as the third color filter layer CF3, and the step compensation layer SCL may simultaneously be formed with the third color filter layer SF3 via the same process. In addition, in an embodiment of the inventive concept, a portion of the step compensation layer SCL may include the same material as the second color filter layer CF2, and another portion of the step compensation layer SCL may include the same material as the third color filter layer CF3.

Referring to FIG. 4A, in a region overlapping the light-blocking region NPXA disposed between adjacent first pixel regions PXA1, the first color filter layer CF1, the light-blocking layer BM, and the step compensation layer SCL may be disposed. That is, the first color filter layer CF1, the light-blocking layer BM and the step compensation layer SCL which are disposed on the light-blocking region NPXA adjacent to the first pixel region PXA1 and absorb external light may have a first thickness TK1.

Referring to FIG. 4B, in a region overlapping the light-blocking region NPXA disposed between adjacent second pixel regions PXA2, the first color filter layer CF1, the light-blocking layer BM, and the second color filter layer CF2 which covers the light-blocking layer BM may be disposed. That is, the layers serving a function of absorbing external light may have a second thickness TK2. The first thickness TK1 and the second thickness TK2 may substantially be the same. Thus, the external light reflectivity at the light-blocking region NPXA disposed between the first pixel regions PXA1 and at the light-blocking region NPXA disposed between the second pixel regions PXA2 may have the same level. Similarly, the layers serving a function of absorbing external light and disposed between adjacent third pixel regions PXA3 may have a thickness substantially the same as the first thickness TK1 and the second thickness TK2.

According to a comparative example of the inventive concept, the step compensation layer SCL disposed between adjacent first pixel regions PXA1 may be omitted. When the step compensation layer SCL disposed between adjacent first pixel regions PXA1 is omitted, only the first color filter layer CF1 and the light-blocking layer BM may be disposed in a region overlapping the light-blocking region NPXA, and the layers having the function of absorbing external light may have a third thickness TK-C. The third thickness TK-C may be smaller than the second thickness TK2. In this case, the external light reflectivity at the light-blocking region NPXA, in which the step compensation layer SCL is omitted, may be higher than at the external light reflectivity at the light-blocking region NPXA of FIG. 4B. However, according to an embodiment of the inventive concept, occurrence of differences in the external light reflectivity may be prevented from occurring because the step compensation layer SCL may compensate the difference in thickness between the light-blocking regions NPXA.

The first protective layer L1 may cover the first to third color filter layers CF1, CF2 and CF3, the step compensation layer SCL, and the light-blocking layer BM. The first protective layer L1 may include any one among silicon oxide, silicon nitride, or silicon oxy-nitride. In another embodiment of the inventive concept, the first protective layer L1 may also be omitted.

Under the first protective layer L1, the transmissive layer TL, the first wavelength conversion layer WCL1 and the second wavelength conversion layer WCL2 may be disposed. The transmissive layer TL may be disposed to overlap the first pixel region PXA1, the first wavelength conversion layer WCL1 may be disposed to overlap the second pixel region PXA2, and the second wavelength conversion layer WCL2 may be disposed to overlap the third pixel region PXA3. That is, the transmissive layer TL may be disposed under the first color filter layer CF1 to overlap the first color filter layer CF1, the first wavelength conversion layer WCL1 may be disposed under the second color filter layer CF2 to overlap the second color filter layer CF2, and the second wavelength conversion layer WCL2 may be disposed under the third color filter layer CF3 to overlap the third color filter layer CF3. The transmissive layer TL may include a first base resin BR1 and first scattering particles SC1, the first wavelength conversion layer WCL1 may include a second base resin BR2, second scattering particles SC2 and first emissive bodies EP1, and the second wavelength conversion layer WCL2 may include a third base resin BR3, third scattering particles SC3 and second emissive bodies EP2.

The first to third base resins BR1, BR2 and BR3 are media in which emissive bodies are scattered and may include various resin compositions which may be generally referred to as binders. The first to third base resins BR1, BR2 and BR3 may be the same resin. However, the embodiment of the inventive concept is not limited thereto, and in this specification, as long as a medium which may scatter and dispose emissive bodies, the medium may be referred to as a base resin regardless of the name, other additional functions, and constituting materials. The base resin may be a polymer resin. For example, the base resin may be an acrylic resin, a urethane-based resin, a silicon-based resin, an epoxy-based resin, or the like. The base resin may be a transparent resin.

Each of the first emissive bodies EP1 and the second emissive bodies EP2 may be a particle which converts the wavelength of light incident onto the first emissive bodies EP1 and the second emissive bodies EP2. For example, each of the first emissive body EP1 and the second emissive body EP2 may be a quantum dot. The first emissive bodies EP1 may convert the light incident from a second element ED2, and the second emissive bodies EP2 may convert the light incident from a third element ED3.

The quantum dots are materials which have crystal structures with sizes of several nanometers, are composed of several hundreds to several thousands of atoms, and exhibit a quantum confinement effect in which an energy band gap increases due to small sizes of the quantum dots. When light with a wavelength having higher energy than the band gap is incident on the quantum dots, the quantum dots absorb the light to thereby transit to an excited state and fall into a ground state while discharging light with a specific wavelength. The wavelength of discharged light has a value corresponding to the band gap. When the sizes and compositions of the quantum dots are adjusted, the emission characteristics of the quantum dots due to the quantum confinement effect may be adjusted. The quantum dots may have a core-shell structure including a core and a shell surrounding the core. In addition, the quantum dots may also have a core/shell structure in which one quantum dot surrounds another quantum dot. The interface between the core and the shell may have a concentration gradient in which the closer to the center, the lower the concentration of atoms present in the shell.

The quantum dots may be particles having nanometer-scale sizes. The quantum dots may have a full width of half maximum (FWHM) of an emission wavelength spectrum of no greater than about 45 nm, favorably no greater than about 40 nm, more favorably no greater than about 30 nm, and in this range, color purity and color reproducibility may be improved. In addition, light emitted through such quantum dots is emitted in all directions, so that an optical viewing angle may be improved.

In addition, the shapes of the quantum dots are shapes which are commonly used in related fields and are not particularly limited. However, more specifically, shapes such as spherical shapes, pyramidal shapes, multi-arm shapes, cubic nanoparticles, nanotubes, nanowires, nanofibers, nano plate-like particles may be used.

According to an embodiment of the inventive concept, the color of discharged light may be altered according to the particle sizes of quantum dots. When the first emissive bodies EP1 and the second emissive bodies EP2 are quantum dots, the particle size of the first emissive bodies EP1 and the particle size of the second emissive bodies EP2 may be different from each other. For example, the particle size of the first emissive bodies EP1 may be larger than the particle size of the second emissive bodies EP2. In this case, the first emissive bodies EP1 may emit light with a longer wavelength than the second emissive bodies EP2.

The transmissive layer TL may provide blue light which is scattered by the first scattering particles SC1 to the first color filter layer CF1, the first wavelength conversion layer WCL1 may convert blue light into red light and provide the red light to the second color filter layer CF2, and the second wavelength conversion layer WCL2 may convert blue light into green light and provide the green light to the third color filter layer CF3. The first color filter layer CF1 may transmit light within the wavelength range of the blue light and absorb other light. The second color filter layer CF2 may transmit light within the wavelength range of the red light and absorb other light. The third color filter layer CF3 may transmit light within the wavelength range of the green light and absorb other light.

The first to third scattering particles SC1, SC2, and SC3 may be $TiO_2$-based or silica-based nanoparticles or the like. The first to third scattering particles SC1, SC2, and SC3 may scatter light. Since the transmissive layer TL does not include an emissive body, the number of first scattering particles SC1 included in the transmissive layer TL may be greater than the number of second scattering particles SC2 included in the first wavelength conversion layer WCL1 or the number of third scattering particles SC3 included in the second wavelength conversion layer WCL2. In another embodiment of the inventive concept, the second and third scattering particles SC2 and SC3 may be omitted.

The second protective layer L2 may cover the first wavelength conversion layer WCL1, the second wavelength conversion layer WCL2, and the transmissive layer TL. The second protective layer L2 may include any one among silicon oxide, silicon nitride, or silicon oxy-nitride. In another embodiment of the inventive concept, the second protective layer L2 may also be omitted.

The second substrate 200 may include a base layer BS2, a circuit layer CCL, a light-emitting element layer EL, and a thin film encapsulation layer TFE. The circuit layer CCL may be disposed on the base layer BS2. The circuit layer CCL may include a plurality of insulating layers, a plurality of conductive layers, and a semiconductor layer. The light-emitting element layer EL may be disposed on the circuit layer CCL. The thin film encapsulation layer TFE may encapsulate the light-emitting element layer EL. In an embodiment of the inventive concept, the thin film encapsulation layer TFE may also be omitted.

The base layer BS2 may be a structure including a silicon substrate, a plastic substrate, a glass substrate, an insulating film, or a plurality of insulating layers.

The circuit layer CCL may include first to third transistors TR1, TR2 and TR3, and a plurality of insulating layers IL1, IL2, IL3 and IL4. The plurality of insulating layers IL1, IL2, IL3 and IL4 may include a first insulating layer IL1, a second insulating layer IL2, a third insulating layer IL3, and a fourth insulating layer IL4.

The first insulating layer IL1 may be disposed on the base layer BS2, the first to third transistors TR1, TR2, and TR3 may be disposed on the first insulating layer ILL The first to third transistors TR1, TR2, and TR3 may have substantially the same structure. Thus, the first transistor TR1 will be representatively described. The first transistor TR1 may include a control electrode CE, an input electrode IE, an output electrode OE, and a semiconductor layer ACL.

The semiconductor layer ACL may be disposed on the first insulating layer ILL The first insulating layer IL1 may be a buffer layer which provides a modified surface to the semiconductor layer ACL. In this case, the semiconductor layer ACL may have higher adhesion to the first insulating layer IL1 than to the base layer BS2. In addition, the first insulating layer IL1 may be a barrier layer which protects the lower surface of the semiconductor layer ACL. In this case, the first insulating layer IL1 may block the infiltration of contaminants, moisture or the like from the base layer BS2 itself into the semiconductor layer ACL and/or through the base layer BS2 from the outside into the semiconductor layer ACL. Alternatively, the first insulating layer IL1 may be a light-blocking layer which prevents external light incident through the base layer BS2 from being incident to the semiconductor layer ACL. In this case, the first insulating layer IL1 may further include a light-blocking material.

The semiconductor layer ACL may include polysilicon or amorphous silicon. Besides, the semiconductor layer ACL may include a metal oxide semiconductor. The semiconductor layer ACL may include: a channel region which functions as a passage through which electrons or holes may move; and a first ion doped region and a second ion doped region which are spaced apart each other with the channel region disposed therebetween.

The second insulating layer IL2 may be disposed on the first insulating layer IL1 and may cover the semiconductor layer ACL. The second insulation layer IL2 may be a gate insulting layer and include an inorganic material. The inorganic material may include at least any one among silicon oxy-nitride, silicon oxide, titanium oxide, or aluminum oxide.

A control electrode CE may be disposed on the second insulating layer IL2. The third insulating layer IL3 may be disposed on the second insulating layer IL2 and may cover the control electrode CE. The third insulating layer IL3 may be composed of a single layer or a plurality of layers. For example, the single layer may include an inorganic layer. The plurality of layers may be provided by laminating an organic layer and an inorganic layer.

The input electrode IE and the output electrode OE may be disposed on the third insulating layer IL3. Each of the input electrode IE and the output electrode OE may be connected to the semiconductor layer ACL via through holes passing through the second insulating layer IL2 and the third insulating layer IL3.

The fourth insulating layer IL4 may be disposed on the third insulating layer IL3 and may cover the input electrode IE and the output electrode OE. The fourth insulating layer IL4 may be composed of a single layer or a plurality of layers. For example, the single layer may include an organic layer. The plurality of layers may be provided by laminating an organic layer and an inorganic layer. The fourth insulating layer IL4 may be a planarization layer providing a flattened surface thereon.

A light-emitting element layer EL may be disposed on the fourth insulating layer IL4.

The light-emitting element layer EL may include a first element ED1, a second element ED2, a third element ED3, and a pixel definition film PDL.

The first element ED1 may be disposed corresponding to the first pixel region PXA1 and overlap the first pixel region PXA1 in a plan view. The second element ED2 may be disposed corresponding to the second pixel region PXA2 and overlap the second pixel region PXA2 in a plan view. The third element ED3 may be disposed corresponding to the third pixel region PXA3 and overlap the third pixel region PXA3 in a plan view.

The first element ED1 may include a first electrode E1-1, a first emissive layer EML-1, and a second electrode E2-1. The second element ED2 may include a first electrode E1-2, a second emissive layer EML-2, and a second electrode E2-2. The third element ED3 may include a first electrode E1-3, a third emissive layer EML-3, and a second electrode E2-3.

The first electrodes E1-1, E1-2 and E1-3 may be disposed on the fourth insulating layer IL4. The first electrodes E1-1, E1-2 and E1-3 may be electrically connected one-to-one to the first to third transistors TR1, TR2 and TR3 via through holes. For example, the first electrode E1-1 may be electrically connected to the first transistor TR1. The first electrode E1-2 may be electrically connected to the second transistor TR2. The first electrode E1-3 may be electrically connected to the third transistor TR3.

The pixel definition film PDL may expose at least a portion of each of the first electrodes E1-1, E1-2, and E1-3.

The first to third emissive layers EML-1, EML-2 and EML-3 may be connected to each other and constitute a single emissive layer. For example, the first to third emissive layers EML-1, EML-2 and EML-3 may be disposed on the pixel definition film PDL and on the first electrodes E1-1, E1-2, and E1-3. The first to third emissive layers EML-1, EML-2 and EML-3 may generate blue light. The first to third emissive layers EML-1, EML-2 and EML-3 may have a tandem structure of a single layer structure.

The second electrodes E2-1, E2-2, and E2-3 may be electrically connected to each other and may constitute a single second electrode. The second electrodes E2-1, E2-2, and E2-3 may be disposed on the first to third emissive layers EML-1, EML-2 and EML-3.

Although not separately shown, a hole control layer may be disposed between the first electrodes and the emissive layers, and an electron control layer may be disposed between the emissive layers and the second electrodes. The hole control layer may include a hole transport layer and/or a hole injection layer, and the electron control layer may include an electron transport layer and/or an electron injection layer.

The thin film encapsulation layer TFE may be disposed on the second electrodes E2-1, E2-2, and E2-3. The thin film encapsulation layer TFE may directly cover the second electrode E2-1, E2-2, and E2-3. In another embodiment of the inventive concept, a capping layer may further be disposed between the thin film encapsulation layer TFE and the second electrodes E2-1, E2-2 and E2-3. In this case, the thin film encapsulation layer TFE may directly cover the capping layer. In another embodiment of the inventive concept, the thin film encapsulation layer TFE may also be omitted.

The thin film encapsulation layer TFE may include a first inorganic layer ECL1, an organic layer ECL2, and a second inorganic layer ECL3 which are sequentially laminated. The organic layer ECL2 may be disposed between the first inorganic layer ECL1 and the second inorganic layer ECL3. The first inorganic layer ECL1 and the second inorganic layer ECL3 may be formed by depositing an inorganic material, and the organic layer ECL2 may be formed by depositing, printing or coating an organic material.

The first inorganic layer ECL1 and the second inorganic layer ECL3 protect the light-emitting element layer EL from moisture and oxygen, and the organic layer ECL2 protects the light-emitting element layer EL from foreign materials such as dust particles. The first inorganic layer and the second inorganic layer ECL3 may include at least any one among silicon nitride, silicon oxy-nitride, silicon oxide, titanium oxide, or aluminum oxide. The organic layer ECL2 may include a polymer, for example, an acryl-based organic layer. However, this is exemplary and the embodiment of the inventive concept is not limited thereto.

FIGS. 4A and 4B exemplarily illustrate that the thin film encapsulation layer TFE includes two inorganic layers and one organic layer, but the embodiment of the inventive concept is not limited thereto. For example, the thin film encapsulation layer TFE may also include three inorganic layers and two organic layers, and in this case, may have a laminated structure in which the inorganic layers and the organic layer are alternately laminated.

Figure 5A:
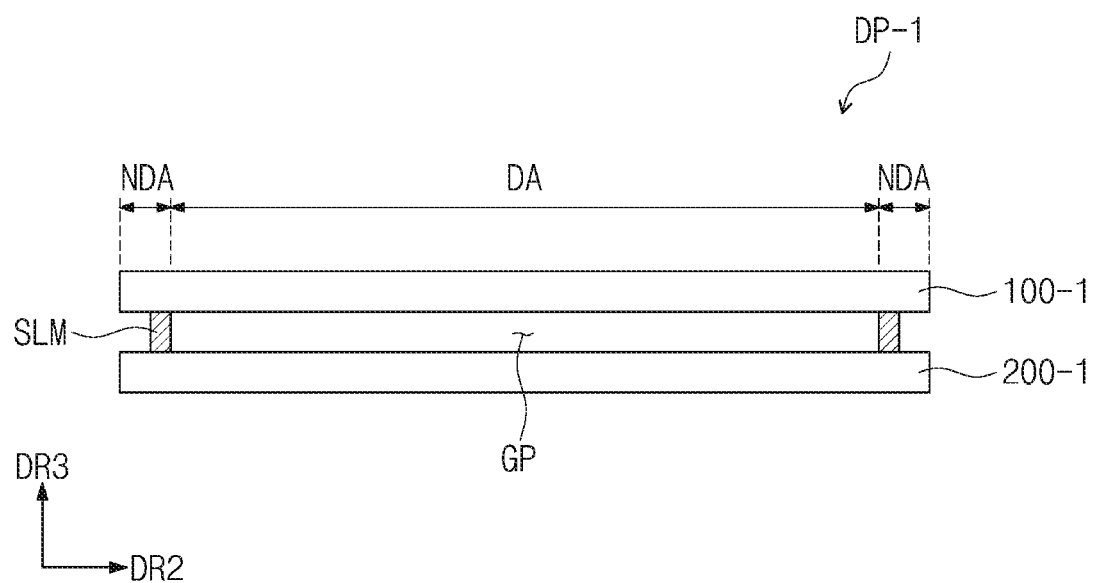
FIG. 5A is a cross-sectional view illustrating a display panel according to an embodiment of the present invention.
Figure 5B:
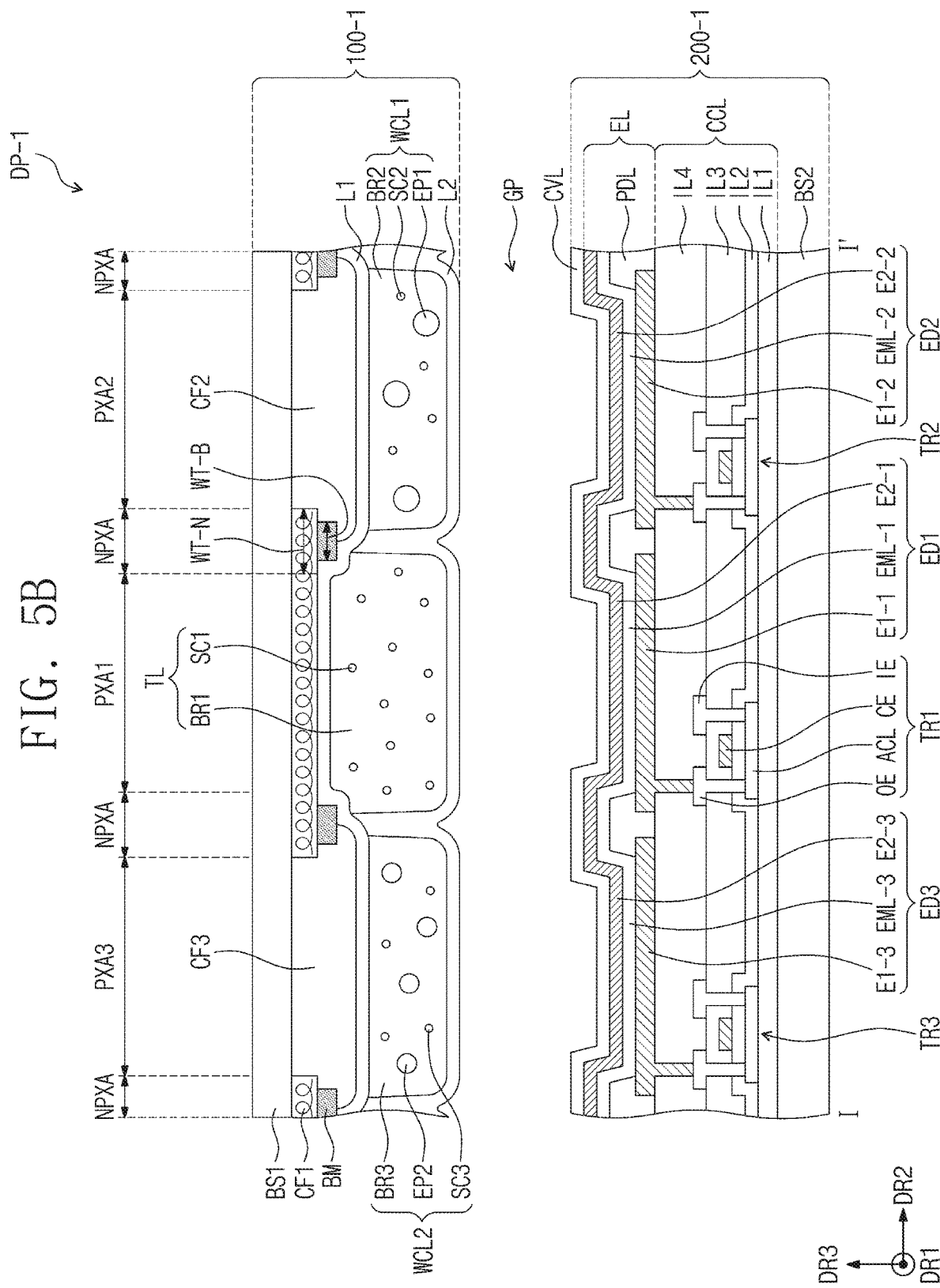
FIG. 5B is a cross-sectional view illustrating pixel regions of a display panel according to an embodiment of the inventive concept.

FIG. 5A is a cross-sectional view of a display panel according to an embodiment of the present invention. FIG. 5B is a cross-sectional view of pixel regions of a display panel according to an embodiment of the inventive concept. In describing FIGS. 5A and 5B, the same reference symbols refer to components described above in FIG. 3, and descriptions thereof will be omitted.

Referring to FIGS. 5A and 5B, a display panel DP-1 may include a first substrate 100-1 and a second substrate 200-1. The first substrate 100-1 may have substantially the same structure as the first substrate 100 of FIG. 3. The second substrate 200-1, compared with the second substrate 200 of FIG. 3, may further include a cover layer CVL and may not include a thin film encapsulation layer TFE (see FIG. 3). The cover layer CVL may be disposed on the second electrodes E2-1, E2-2 and E2-3 and may protect the second electrodes E2-1, E2-2 and E2-3. The cover layer CVL may include an organic material or an inorganic material. In one embodiment, the cover layer CVL and the thin film encapsulation layer TFE (see FIG. 3) may be omitted.

The first substrate 100-1 and the second substrate 200-1 may face each other and be spaced apart from each other. Thus, a predetermined cell gap GP may be provided between the first substrate 100-1 and the second substrate 200-1.

The cell gap GP may be maintained by means of a sealant SLM which couples the first substrate 100-1 and the second substrate 200-1. The sealant SLM may include an organic adhesive member or an inorganic adhesive member. The sealant SLM may include frit.

Figure 6:
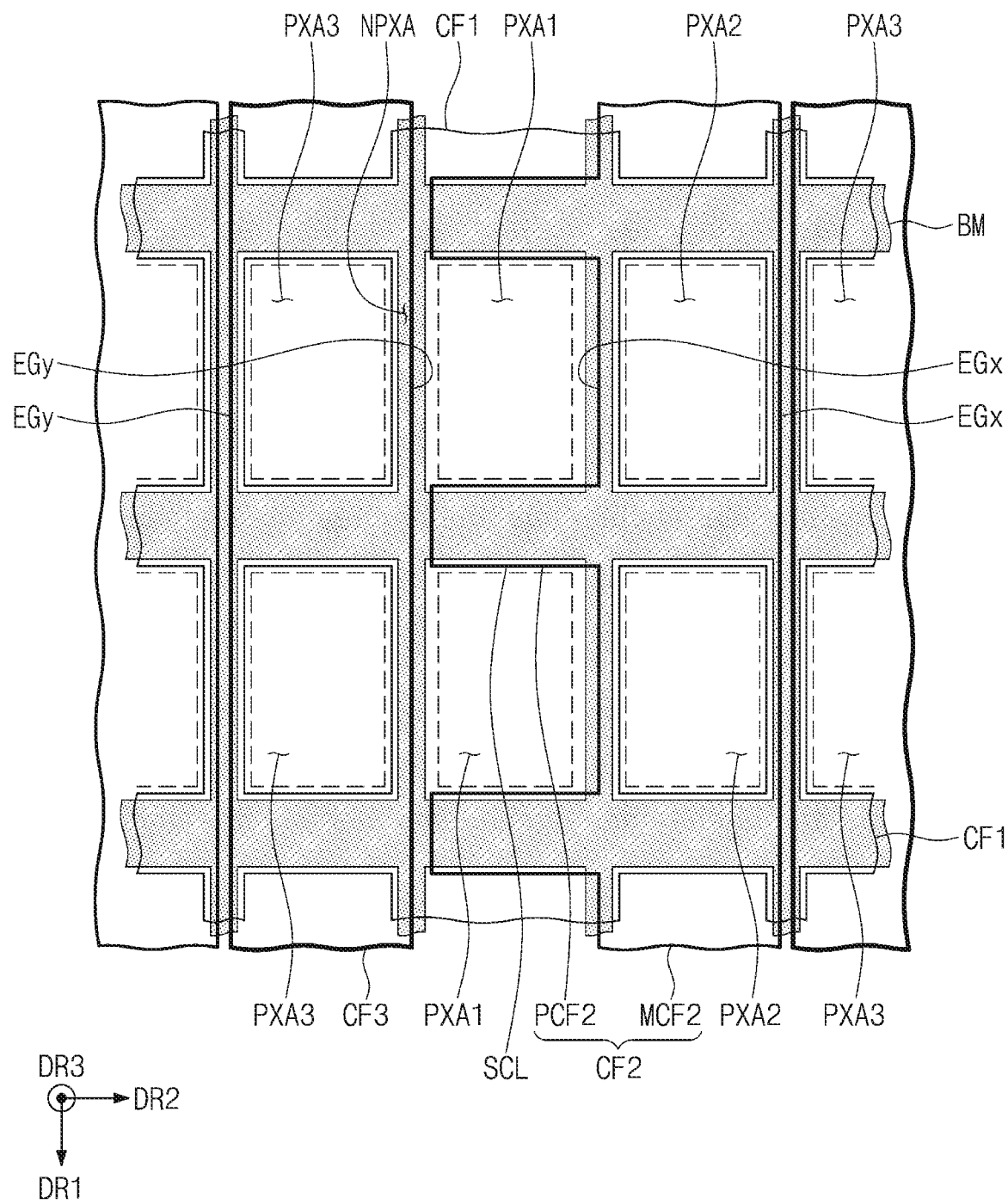
FIG. 6 is a plan view illustrating a portion of configurations of a display panel according to an embodiment of the inventive concept.

FIG. 6 is a plan view illustrating a portion of configurations of a display panel according to an embodiment of the inventive concept. FIG. 6 illustrates first pixel regions PXA1, second pixel regions PXA2, third pixel regions PXA3 and a light-blocking region NPXA.

Referring to FIG. 6, the first color filter layer CF1 may overlap the first pixel regions PXA1 and the light blocking region NPXA in a plan view. The first color filter layer CF1 may have openings in regions overlapping the second pixel regions PXA2 and the third pixel regions PXA3.

The second color filter layer CF2 may overlap the second pixel regions PXA2 and the light-blocking region NPXA disposed between adjacent second pixel regions PXA2 and the light-blocking region NPXA disposed between adjacent first pixel regions PXA1. The second color filter layer CF2 may include a second color main part MCF2 overlapping the second pixel regions PXA2 and a second color protruding part PCF2 overlapping the light-blocking region NPXA disposed between the adjacent first pixel regions PXA1. The second color main part MCF2 may extend in the first direction DR1. The second color protruding part PCF2 may protrude from the second color main part MCF2 toward the light-blocking region NPXA disposed between the adjacent first pixel regions. The second color protruding part PCF2 may constitute a step compensation layer SCL. That is, the step compensation layer SCL may be the second color protruding part PCF2.

The third color filter layer CF3 may overlap the third pixel regions PXA3 and the light-blocking region NPXA disposed between adjacent third pixel regions PXA3. The third color filter layer CF3 may extend in the first direction DR1.

Each of edges EGx of the second color main part MCF2 which extend in the first direction DR1 may be disposed on the light-blocking layer BM. Each of edges EGy of the third color filter layer CF3 which extend in the first direction DR1 may be disposed on the light-blocking layer BM.

Figure 7:
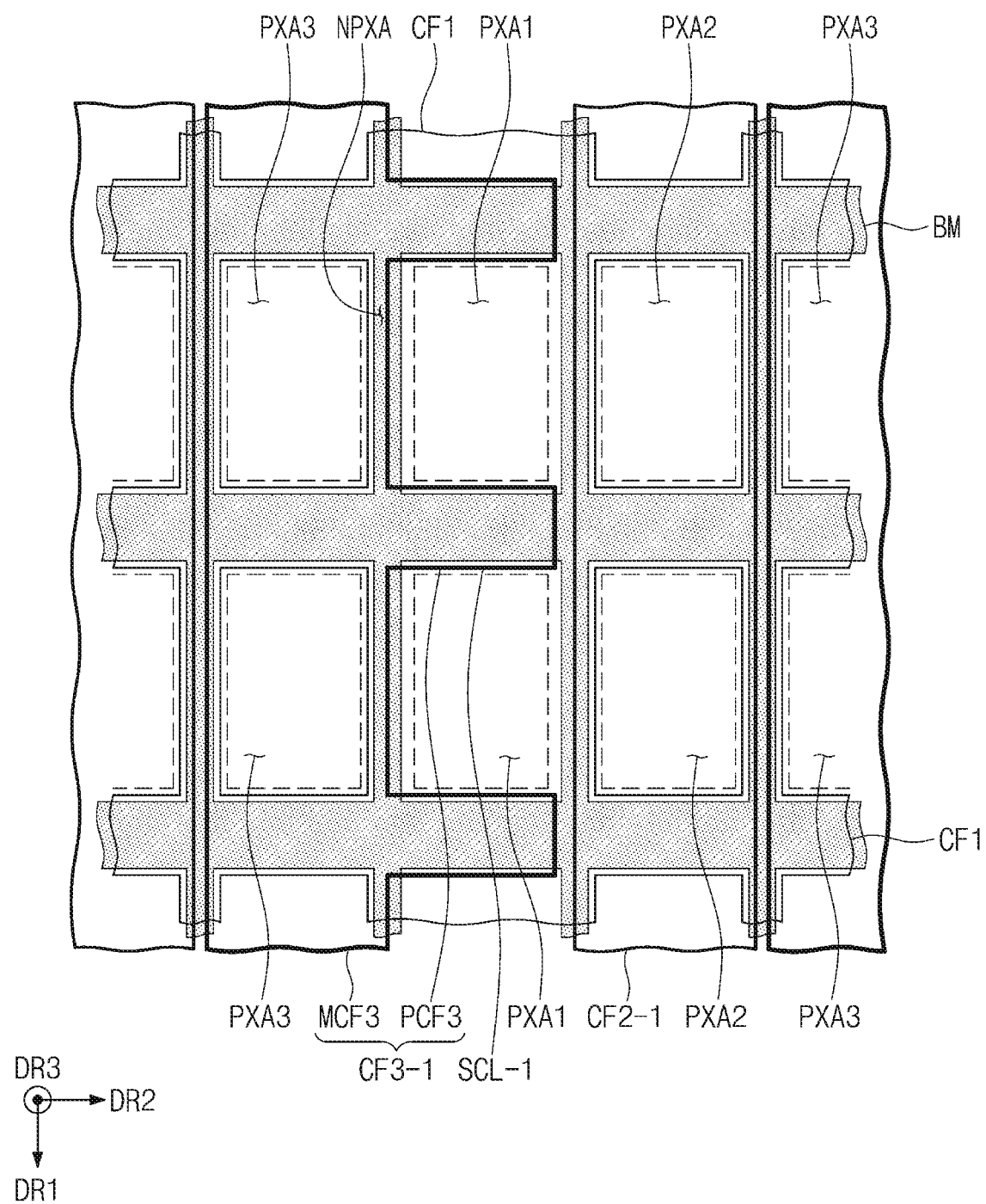
FIG. 7 is a plan view illustrating a portion of configurations of a display panel according to an embodiment of the inventive concept.

FIG. 7 is a plan view illustrating a portion of configurations of a display panel according to an embodiment of the inventive concept.

Referring to FIG. 7, a second color filter layer CF2-1 may overlap second pixel regions PXA2 and a light-blocking region NPXA disposed between adjacent second pixel regions PXA2. The second color filter layer CF2-1 may extend in the first direction DR1.

A third color filter layer CF3-1 may overlap third pixel regions PXA3 and the light-blocking region NPXA disposed between adjacent third pixel regions PXA3 and the light-blocking region NPXA disposed between adjacent first pixel regions PXA1. The third color filter layer CF3-1 may include a third color main part MCF3 and a third color protruding part PCF3. The third color main part MCF3 may extend in the first direction DR1. The third color main part MCF3 may overlap the third pixel regions PXA3. The third color protruding part PCF3 may protrude from the third color main part MCF3 toward the light-blocking region NPXA disposed between two first pixel regions adjacent to each other among the first pixel regions PXA1. The third color protruding part PCF3 may constitute a step compensation layer SCL-1. That is, the step compensation layer SCL-1 may be the third color protruding part PCF3.

Figure 8:
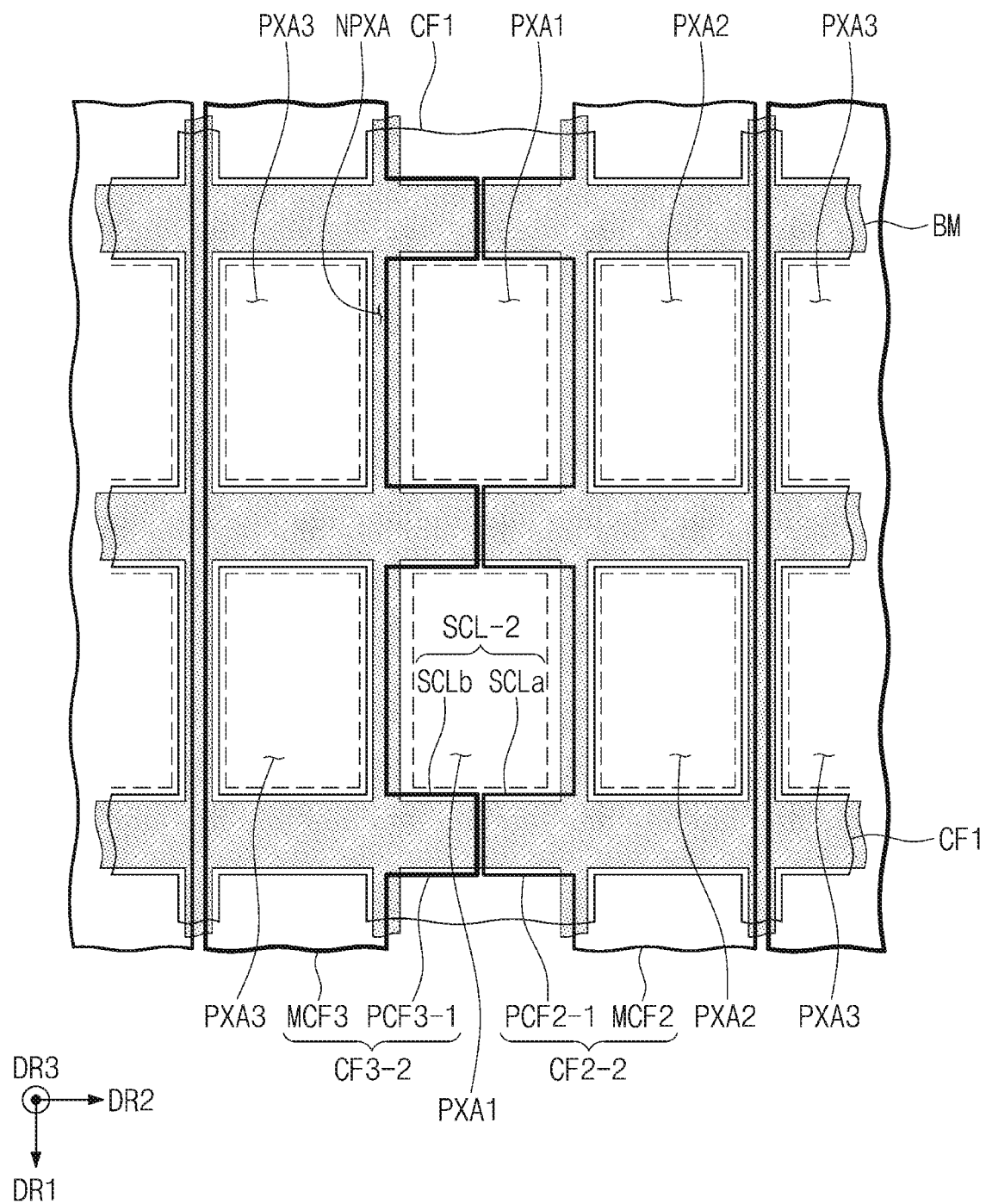
FIG. 8 is a plan view illustrating a portion of configurations of a display panel according to an embodiment of the inventive concept.

FIG. 8 is a plan view illustrating a portion of configurations of a display panel according to an embodiment of the inventive concept.

Referring to FIG. 8, a second color filter layer CF2-2 may overlap second pixel regions PXA2 and a light-blocking region NPXA disposed between adjacent second pixel regions PXA2 and the light-blocking region NPXA disposed between adjacent first pixel regions PXA1. The second color filter layer CF2 may include a second color main part MCF2 and a second color protruding part PGF2-1. The second color main part MCF2 may extend in the first direction DR1. The second color main part MCF2 may overlap the second pixel regions PXA2. The second color protruding part PGF2-1 may protrude from the second color main part MCF2 toward the light-blocking region NPXA disposed between two first pixel regions adjacent to each other among the first pixel regions PXA1.

A third color filter layer CF3-2 may overlap third pixel regions PXA3 and the light-blocking region NPXA disposed between adjacent third pixel regions PXA3 and the light-blocking region NPXA disposed between adjacent first pixel regions PXA1. The third color filter layer CF3-2 may include a third color main part MCF3 and a third color protruding part PCF3-1. The third color main part MCF3 may extend in the first direction DR1. The third color main part MCF3 may overlap the third pixel regions PXA3. The third color protruding part PCF3-1 may protrude from the third color main part MCF3 toward the light-blocking region NPXA disposed between two first pixel regions adjacent to each other among the first pixel regions PXA1.

The second color protruding part PGF2-1 and the third color protruding part PCF3-1 may constitute a step compensation layer SCL-2. The length of the second color protruding part PGF2-1 in the protruding direction may be shorter than the length of the second color protruding part PGF2 of FIG. 6. The length of the third color protruding part PCF3-1 in the protruding direction may be shorter than the length of the third color protruding part PCF3 of FIG. 7.

The step compensation layer SCL-2 may include a first step compensation layer SCLa and a second step compensation layer SCLb. The first step compensation layer SCLa may be the second color protruding part PGF2-1, and the second step compensation layer SCLb may be the third color protruding part PCF3-1. The first step compensation layer SCLa and the second step compensation layer SCLb may contact each other on the light-blocking region NPXA disposed between the first pixel regions PXA1. The first step compensation layer SCLa and the second step compensation layer SCLb may overlap each other on the light-blocking region NPXA disposed between the first pixel regions PXA1.

Figure 9:
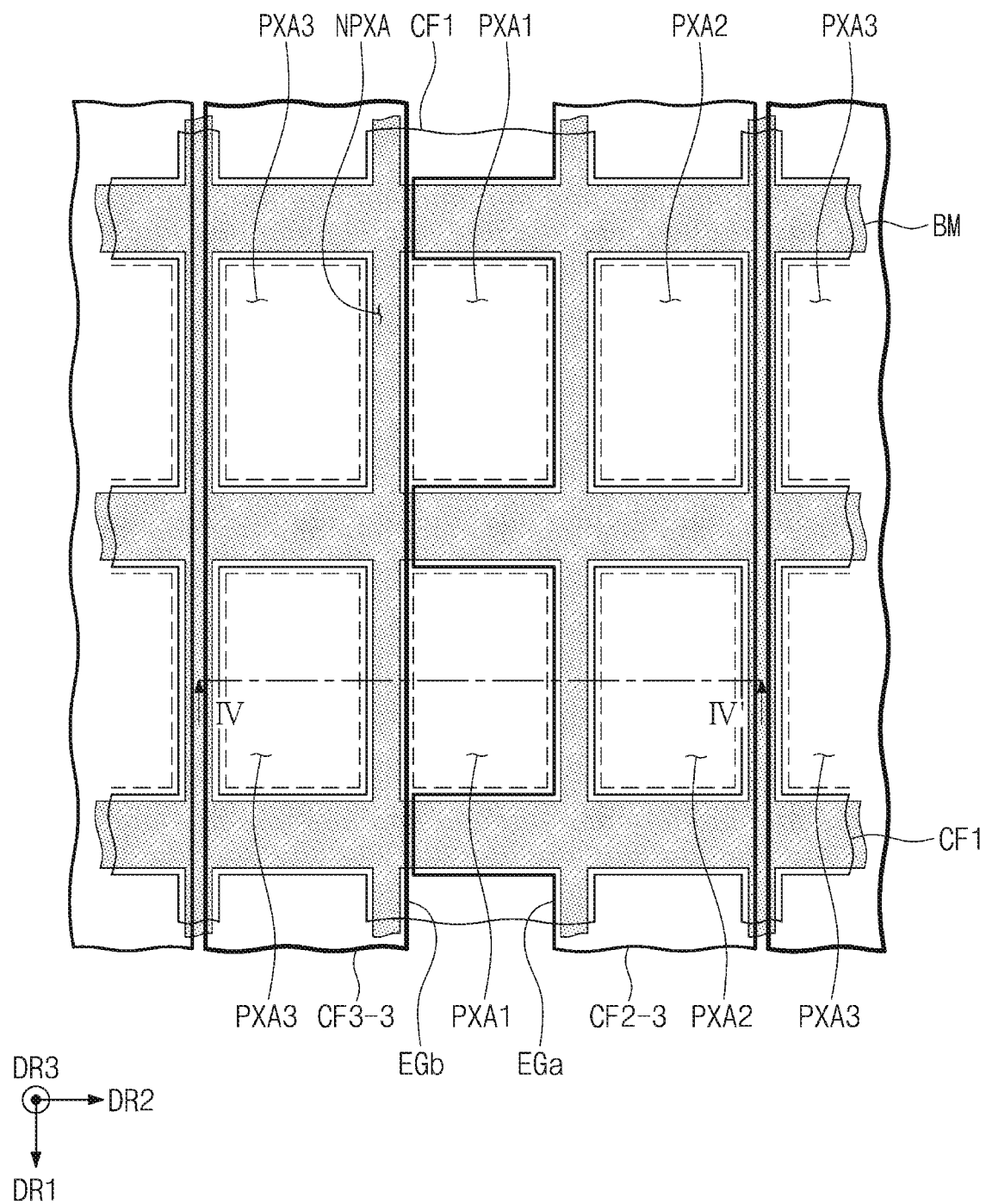
FIG. 9 is a plan view illustrating a portion of configurations of a display panel according to an embodiment of the inventive concept.
Figure 10:
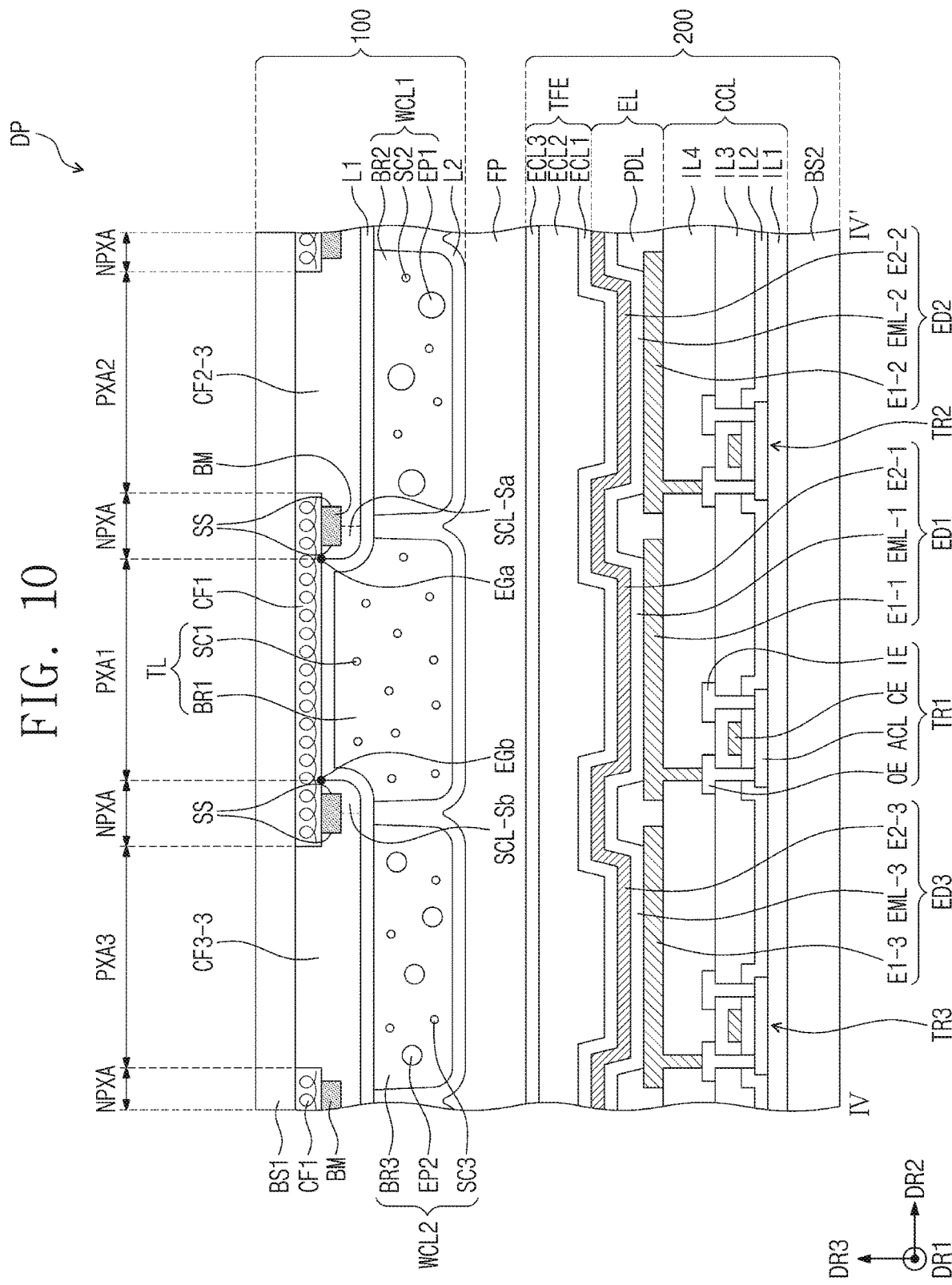
FIG. 10 is a cross-sectional view taken along line IV-IV' of FIG. 9.

FIG. 9 is a plan view illustrating a portion of configurations of a display panel according to an embodiment of the inventive concept. FIG. 10 is a cross-sectional view taken along line IV-IV' of FIG. 9.

Referring to FIGS. 9 and 10, a second color filter layer CF2-3 may cover a portion of light-blocking layer BM disposed between first pixel regions PXA1 and second pixel regions PXA2, and a third color filter layer CF3-3 may cover a portion of light-blocking layer BM disposed between the first pixel regions PXA1 and the third pixel regions PXA3.

An edge EGa of the second color filter layer CF2-3 disposed adjacent to the first pixel regions PXA1 among edges extending in the first direction may not disposed on the light-blocking layer BM. An edge EGb of the third color filter layer CF3-3 disposed adjacent to the first pixel regions PXA1 among edges extending in the first direction may not disposed on the light-blocking layer BM. For example, each of the edges EGa and EGb may be disposed between the light-blocking layer BM and the first pixel region PXA1 in a plan view to completely cover a respective light-blocking layer among the light-blocking layers BM disposed opposite to each other with the first pixel regions PXA1 disposed therebetween.

When compared with the second color filter layer CF2 of FIG. 3, the second color filter layer CF2-3 of FIG. 9 may extend toward the first pixel region PXA1 to completely cover side surfaces SS of the light-blocking layer BM. A portion of the second color filter layer CF2-3 covering the light-blocking layer BM may be referred to as a step compensation part SCL-Sa. When compared with the third color filter layer CF3 of FIG. 3, the third color filter layer CF3-3 of FIG. 9 may extend toward the first pixel region PXA1 to completely cover the side surfaces SS of the light-blocking layer BM. A portion of the third color filter layer CF3-3 covering the light-blocking layer BM may be referred to as a step compensation part SCL-Sb. The side surfaces SS of the light-blocking layer BM may all be covered by the step compensation parts SCL-Sa and SCL-Sb.

FIG. 11 is a cross-sectional view of a display panel according to an embodiment of the inventive concept. A display panel DP-2 may be a liquid crystal display panel.

Referring to FIG. 11, pixels of the display panel DP-2 may include, as an equivalent circuit, a transistor TR, a liquid crystal capacitor Clc, and a storage capacitor Cst. The first transistor TR may include a control electrode CEL, an input electrode IEL, an output electrode OEL, and an active layer AL.

The display panel DP-2 may include a first substrate 100-2, a second substrate 200-2, and a liquid crystal layer 300. The liquid crystal layer 300 may be disposed between the first substrate 100-2 and the second substrate 200-2.

A spacer CS may be disposed between the first substrate 100-2 and the second substrate 200-2. The spacer CS may overlap light-blocking region NPXA in a plan view.

The display panel DP-2 may include first and second polarizer layers PL1 and PL2. The first polarizer layer PL1 may be disposed under the second substrate 200-2. The second polarizer layer PL2 may be formed on the first substrate 100-2. The second polarizer layer OL2 may include a wire grid.

The control electrode CEL and a storage line STL are disposed on one surface of a base layer BS2. The base layer BS2 may be a glass substrate or a plastic substrate. A first insulating layer ILL1 which covers the control electrode CEL and the storage line STL may be disposed on the one surface of the base layer BS2. The first insulation layer ILL1 may include at least any one of an inorganic material or an organic material.

The active layer AL overlapping the control electrode CEL is disposed on the first insulation layer ILL1. The active layer AL may include a semiconductor layer ACL and an ohmic contact layer OCL. The semiconductor layer ACL is disposed on the first insulating layer ILL1, and the ohmic contact layer OCL is disposed on the semiconductor layer ACL.

The semiconductor layer ACL may include amorphous silicon or polysilicon. In addition, the semiconductor layer ACL may include a metal oxide semiconductor. The ohmic contact layer OCL may be a highly doped semiconductor layer. The ohmic contact layer OCL may include two portions spaced apart from each other.

The input electrode IEL and the output electrode OEL are disposed on the active layer AL. The input electrode IEL and the output electrode OEL are disposed to be spaced apart from each other. A second insulating layer ILL2 which covers the active layer AL, the input electrode IEL, and the output electrode OEL is disposed on the first insulation layer ILL1. The second insulating layer ILL2 may be an inorganic layer.

A third insulating layer ILL3 is disposed on the second insulating layer ILL2. The third insulating layer ILL3 may be an organic layer which provides a flattened surface. A fourth insulating layer ILL4 is disposed on the third insulating layer ILL3. The fourth insulating layer ILL4 may be an inorganic layer.

A pixel electrode PE is disposed on the fourth insulating layer ILL4. The pixel electrode PE is connected to the output electrode OEL through a contact hole CH which passes through the second insulating layer ILL2, the third insulating layer ILL3, and the fourth insulating layer ILL4. An alignment film (not shown) which covers the pixel electrode PE may be disposed on the fourth insulating layer ILL4.

A base layer BS1 may be a glass substrate or a plastic substrate. An intermediate layer IL, a second polarizer layer PL2, and a common electrode CME are disposed on the lower surface of the base layer BS1.

The liquid crystal layer 300 may alters light transmitted through the liquid crystal layer according to a charged voltage in the liquid crystal capacitor Clc, and the source light provided from a backlight unit may pass through the first polarizer layer PL1, the liquid crystal layer 300, and the second polarizer layer PL2 and be selectively provided to the intermediate layer IL.

An element on the display panel DP-2 may include a transistor TR and a pixel electrode PE. The pixel electrode PE may face the first substrate 100-2 with the liquid crystal layer 300 disposed therebetween. The pixel electrode PE and the common electrode CME may form an electric field in the liquid crystal layer 300. Arrangement of the liquid crystal molecules in the liquid crystal layer 300 may be altered by the electric field.

In this embodiment, the intermediate layer IL is simply illustrated, but the intermediate layer IL may have a laminated structure disposed on the lower surface of the base layer BS1 in FIG. 3, or a laminated structure disposed on the lower surface of the base layer BS1 in FIG. 10. Meanwhile, the cross-sectional surface illustrated in FIG. 11 is merely one example. FIG. 11 exemplarily describes a vertical alignment mode liquid crystal display panel, but in one embodiment of the inventive concept, a liquid crystal display panel of an in-plane switching (IPS) mode, a fringe-field switching (FFS) mode, a plane to line switching (PLS) mode, a super vertical alignment (SVA) mode, or surface-stabilized vertical alignment (SS-VA) mode may be used.

According to embodiments of the inventive concept, differences in thicknesses of layers having function of absorbing external light at a light-blocking region may be compensated by a step compensation layer. Thus, for each region in the light-blocking region, occurrence of a difference in external light reflectivity may be prevented.

It will be apparent to those skilled in the art that various modifications and variations can be made in the inventive concept. Thus, it is intended that the inventive concept covers the modifications and variations of this invention provided they come within the scope of the appended claims and their equivalents. Therefore, the scope of the inventive concept is defined not by the detailed description of the inventive concept but by the appended claims.

What is claimed is:

1. A display panel comprising:
a first substrate comprising first pixel regions, second pixel regions, third pixel regions, and a light-blocking region which are defined therein; and
a second substrate comprising a first element, a second element, and a third element respectively corresponding one-to-one to the first pixel regions, the second pixel regions, and the third pixel regions,
wherein the first substrate comprises:
a base layer,
a first color filter layer disposed on one surface of the base layer and overlapping the light-blocking region and the first pixel regions in a plan view,
a light-blocking layer disposed on one surface of the first color filter layer and overlapping the light-blocking region in a plan view,
a second color filter layer disposed on the one surface of the base layer and overlapping the second pixel regions in a plan view,
a third color filter layer disposed on the one surface of the base layer and overlapping the third pixel regions in a plan view, and
a step compensation layer disposed on one surface of the light-blocking layer to overlap the first color filter layer and the light-blocking layer disposed between adjacent first pixel regions and not to overlap the adjacent first pixel regions in a plan view.

2. The display panel of claim 1, wherein the step compensation layer comprises the same material as the second color filter layer or the same material as the third color filter layer.

3. The display panel of claim 1, wherein the step compensation layer comprises a first step compensation layer and a second step compensation layer, and
wherein the first step compensation layer comprises the same material as the second color filter layer, and the second step compensation layer comprises the same material as the third color filter layer.

4. The display panel of claim 1, wherein the first color filter layer is a blue color filter layer, the second color filter layer is a red color filter layer, and the third color filter layer is a green color filter layer.

5. The display panel of claim 1, wherein the first pixel regions are defined in a first direction, the second pixel regions are defined in the first direction, and the third pixel regions are defined in the first direction.

6. The display panel of claim 5, wherein the second color filter layer comprises:
a second color main part covering the second pixel regions and extending in the first direction, and
a second color protruding part protruding from the second color main part in a second direction crossing the first direction, and
wherein the second color protruding part constitutes the step compensation layer.

7. The display panel of claim 5, wherein the third color filter layer comprises:
a third color main part covering the third pixel regions and extending in the first direction; and
a third color protruding part protruding from the third color main part in a second direction crossing the first direction,
wherein the third color protruding part constitutes the step compensation layer.

8. The display panel of claim 5, wherein the second color filter layer comprises:

a second color main part configured to cover the second pixel regions and extending in the first direction, and
a second color protruding part protruding from the second color main part in a second direction crossing the first direction,
wherein the third color filter layer comprises:
a third color main part configured to cover the third pixel regions and extending in the first direction, and
a third color protruding part protruding from the third color main part in a direction toward the second color protruding part, and
wherein the second color protruding part and the third color protruding part constitute the step compensation layer.

9. The display panel of claim 5, wherein the step compensation layer is disposed between the first pixel regions adjacent to each other, between the first pixel regions and the second pixel regions, and between the first pixel regions and the third pixel regions in a plan view.

10. The display panel of claim 1, wherein side surfaces of the light-blocking layer are completely covered by the step compensation layer.

11. The display panel of claim 1, wherein the first substrate further comprises:
a transmissive layer disposed under the first color filter layer and overlapping the first pixel regions in a plan view;
a first wavelength conversion layer disposed under the second color filter layer and overlapping the second pixel regions in a plan view; and
a second wavelength conversion layer disposed under the third color filter layer and overlapping the third pixel regions in a plan view.

12. The display panel of claim 11, wherein
the transmissive layer comprises a base resin and a scattering body dispersed in the base resin,
the first wavelength conversion layer comprises a first emissive body configured to convert a wavelength of light incident from the second element, and
the second wavelength conversion layer comprises a second emissive body different from the first emissive body and configured to convert a wavelength of light incident from the third element.

13. The display panel of claim 1, wherein each of the first element, the second element, and the third element comprises a first electrode, a second electrode and an emissive layer disposed between the first electrode and the second electrode, and
the emissive layers of the first element, the second element, and the third element have an integrated shape.

14. The display panel of claim 1, further comprising a liquid crystal layer disposed between the first substrate and the second substrate,
wherein each of the first element, the second element, and the third element comprises a pixel electrode.

15. A display panel comprising:
a first base layer;
a circuit layer disposed on the first base layer;
a second base layer facing the first base layer, the second base layer including first pixel regions disposed in a first direction, second pixel regions disposed in the first direction, third pixel regions disposed in the first direction and a light-blocking region surrounding the first to third pixel regions;
a first color filter layer disposed under the second base layer and overlapping the light-blocking region and the first pixel regions in a plan view;
a light-blocking layer disposed under the first color filter layer and overlapping the light-blocking region in a plan view;
a second color filter layer disposed under the second base layer and overlapping the second pixel regions in a plan view;
a third color filter layer disposed under the second base layer and overlapping the third pixel regions in a plan view; and
a step compensation layer disposed under the light-blocking layer, overlapping the light-blocking region disposed between adjacent first pixel regions and not overlapping the adjacent first pixel regions in a plan view,
wherein a portion of the first color filter layer is disposed between the second base layer and the light-blocking layer.

16. The display panel of claim 15, wherein the first pixel regions, the second pixel regions, and the third pixel regions are alternately defined in a second direction crossing the first direction.

17. The display panel of claim 16, wherein
the second color filter layer extends in the first direction,
the step compensation layer protrudes from the second color filter layer in the second direction, and
the step compensation layer comprises the same material as the second color filter layer.

18. The display panel of claim 16, wherein
the step compensation layer comprises a first step compensation layer and a second step compensation layer,
the second color filter layer extends in the first direction,
the first step compensation layer protrudes from the second color filter layer in the second direction,
the first step compensation layer comprises the same material as the second color filter layer,
the third color filter layer extends in the first direction, the second step compensation layer protrudes from the third color filter layer in the second direction, and
the second step compensation layer comprises the same material as the third color filter layer.

19. The display panel of claim 18, wherein the first step compensation layer and the second step compensation layer are disposed between the adjacent first pixel regions in the first direction.

20. A color conversion panel comprising:
a base layer including first pixel regions and second pixel regions and a light-blocking region surrounding the first pixel regions and the second pixel regions;
a first color filter layer disposed to overlap the first pixel regions and the light-blocking region in a plan view;
a light-blocking layer disposed to overlap the light-blocking region in a plan view; and
a second color filter layer disposed to overlap the second pixel regions and the light-blocking layer in a plan view,
wherein the second color filter layer includes a first portion extending in a first direction and a second portion extending substantially perpendicular to the first direction, and
wherein the second portion extends between adjacent first pixel regions to overlap the first color filter layer and the light-blocking layer disposed between adjacent first pixel regions and not to overlap the adjacent first pixel regions in a plan view.

21. The color conversion panel of claim 20, wherein the second portion completely covers a top surface and side surfaces of the light-blocking layer.

\* \* \* \* \*